United States Patent
Bhushan et al.

(10) Patent No.: US 7,069,525 B2
(45) Date of Patent: Jun. 27, 2006

(54) METHOD AND APPARATUS FOR DETERMINING CHARACTERISTICS OF MOS DEVICES

(75) Inventors: Manjul Bhushan, Hopewell Junction, NY (US); Mark B. Ketchen, Hadley, MA (US)

(73) Assignee: International Business Machines Corporation, Armonk, NY (US)

( * ) Notice: Subject to any disclaimer, the term of this patent is extended or adjusted under 35 U.S.C. 154(b) by 380 days.

(21) Appl. No.: 10/623,249

(22) Filed: Jul. 18, 2003

(65) Prior Publication Data

US 2005/0012556 A1 Jan. 20, 2005

(51) Int. Cl.
*G06F 17/50* (2006.01)
(52) U.S. Cl. .............................................. 716/4; 716/1
(58) Field of Classification Search ................ 716/1–5, 716/3–12; 331/57, 46–49
See application file for complete search history.

(56) References Cited

U.S. PATENT DOCUMENTS

| 4,853,654 A | * | 8/1989 | Sakurai | 331/57 |
| 5,446,418 A | * | 8/1995 | Hara et al. | 331/57 |
| 6,493,851 B1 | * | 12/2002 | Bach et al. | 716/4 |
| 6,683,503 B1 | * | 1/2004 | Mizuno et al. | 331/46 |
| 6,821,859 B1 | * | 11/2004 | Raebiger et al. | 438/303 |
| 6,825,732 B1 | * | 11/2004 | Motoyama | 331/57 |

OTHER PUBLICATIONS

Taur et al., "Fundamentals of Modern VLSI Devices," 5.3 Sensitivity of CMOS Delay to Device Parameters, 5.3:1-4.3, pp. 257-273 (1998).

* cited by examiner

*Primary Examiner*—Stacy A. Whitmore
*Assistant Examiner*—Nghia M. Doan
(74) *Attorney, Agent, or Firm*—Ryan, Mason & Lewis, LLP; Stephen C. Kaufman, Esq.

(57) ABSTRACT

A set of ring oscillators is formed within a predetermined distance of each other. Each ring oscillator includes a number of coupled stages. The stages for a first given ring oscillator include an inverter having one or more first MOS devices having a first gate length. The stages for a second given ring oscillator include one or more second MOS devices having a second designed gate length. The stages for a third given ring oscillator comprise one or more third MOS devices having a third designed gate length. The second and third designed gate lengths are different and one of the second and third designed gate lengths is approximately equal to the first designed gate length. Performance is measured by using one of more of the given ring oscillators. The set of ring oscillators is used to determine one or more additional characteristics of MOS devices in the ring oscillators.

31 Claims, 5 Drawing Sheets

METHOD AND APPARATUS FOR DETERMINING CHARACTERISTICS OF MOS DEVICES

FIELD OF THE INVENTION

The present invention relates to semiconductors and, more particularly, relates to metal oxide semiconductor (MOS) characterization.

BACKGROUND OF THE INVENTION

The ability to measure the parameters of MOS devices is of great value, especially for technology development and accurate modeling of complementary MOS (CMOS) gate delays and leakage currents. The latter are important for circuit design applications and chip power management. Two examples of MOS characteristics are the physical gate length (Lpoly) and gate oxide thickness (Tox) for MOS field effect transistors (MOSFETs), and these characteristics are extremely important for determining the performance of MOS circuits.

Direct current (DC) characteristics of a MOSFET provide a direct technique for measuring threshold voltage, Vt, for the MOSFETs on a semiconductor. In CMOS technologies prior to generations having linewidths of about 0.18 pm, the effective length of the gate, Leff, was determined by extrapolation of the channel resistance of MOSFETs as a function of the designed gate length, Lmask. With the scaling of CMOS technologies, the scatter in the Leff measurement has become significant, and Leff has now been replaced by the measurement of physical gate length, Lpoly. The Lpoly is generally estimated from the resistance of the film constituting the gate or from the gate oxide capacitance for a constant thickness of the gate oxide, Tox. As the physical gate oxide thickness is reduced below 1.5 nm (such as 0.13 μm linewidth technology generation and beyond), the DC tunneling current interferes with the capacitance measurement.

Thus, what is needed are improved techniques for measuring characteristics of MOS devices.

SUMMARY OF THE INVENTION

Methods and apparatus are presented for determining characteristics of MOS devices.

In an aspect of the invention, a set of ring oscillators are provided. The set of ring oscillators is formed within a predetermined distance. Each ring oscillator includes a number of coupled stages. Each of the number of coupled stages for a first given ring oscillator includes an inverter having one or more first MOS devices having a first gate length. Each of the number of stages for a second given ring oscillator includes an inverter substantially identical to the inverters in the coupled stages of the first ring oscillator plus one or more second MOS devices having a second designed gate length. Each of the number of stages for a third given ring oscillator includes an inverter substantially identical to the inverters in the coupled stages of the first ring oscillator plus one or more third MOS devices having a third designed gate length. The second and third designed gate lengths are different and one of the second and third designed gate lengths is approximately equal to the first designed gate length. Performance is measured by using one or more of the given ring oscillators. The set of ring oscillators is used to determine one or more additional characteristics of MOS devices in the ring oscillators.

Beneficially, performance may be determined by causing a selected ring oscillator to oscillate so that a delay of a stage in the selected ring oscillator is under 30 picoseconds. Additionally, the predetermined distance in which the set of ring oscillators is formed may be 1,000 microns or less.

Advantages of the present invention include, but are not limited to, that across-chip variations are minimized and that the characterization can occur using MOS devices similar or exactly equal to those used in the technology for high performance circuit applications and can occur at speeds similar to those attainable by the technology in high performance circuit applications. Moreover, many different characteristics of MOS devices may be obtained from the same set of ring oscillators.

For example, frequency of oscillation for the ring oscillators may be determined. The delay per stage for the ring oscillators may be determined by using the frequency of oscillation. The delay per stage is a measure of performance. The active and quiescent currents for the ring oscillators can be determined. The capacitance for the MOS devices making up a stage of each ring oscillator may be determined by using the active and quiescent currents and the delay.

In general, because the second and third designed gate lengths are different lengths, the capacitances associated with the second and third given ring oscillator stages should be different. These different capacitances may be used to determine a bias gate length, from which a physical gate length may be determined. The capacitances may also be used to determine the thickness of the oxide used in MOS gates. Additional characteristics may also be determined, such as effective gate resistance, gate tunneling current, channel leakage current per unit width, and active power.

In an illustrative embodiment, the set of ring oscillators are coupled together as a single test structure. Using the single test structure allows multiple MOS characteristics to be determined at one location and from the same set of test MOS devices so that design and layout variations between different test structures are not present. As described above, this also provides benefits of reduced across-chip variation in measurements and characteristics that may be determined under use conditions (e.g., delay of 30 picoseconds or less for a stage of a ring oscillator). The coupled ring oscillators can have outputs that pass through a single frequency divider, which is used to lower the frequency to an amount more easily read by a conventional frequency counting instrument. Additionally, outputs from the ring oscillators can be passed to a frequency counter, which can be integrated with the set of ring oscillators on a semiconductor. This, together with a clock, can generate an output indication of the frequency at which a ring oscillator is oscillating.

Separate power supplies may be used for each of the ring oscillators and for control and output circuitry, which may be used to couple the ring oscillators together. A benefit, among others, of having separate power supplies is that the current drawn by an individual ring can be independently measured and the large current drawn by the output driver does not affect the frequency of the ring oscillator. Additionally, each ring oscillator may be powered separately. Additional circuitry may be used to select only the powered ring oscillator for measurement purposes.

A more complete understanding of the present invention, as well as further features and advantages of the present invention, will be obtained by reference to the following detailed description and drawings.

DETAILED DESCRIPTION OF PREFERRED EMBODIMENTS

Conventional structures for determining metal-oxide-semiconductor (MOS) device characteristics have additional problems than those described previously. For example, the measurement of quantities such as the physical gate length, Lpoly, and the thickness of the gate oxide, Tox, are determined by using separate test structures. Generally, the structures are created in the kerf area, which is an area surrounding active chip areas, although the structures may also be placed in the active chip areas themselves. The measurements are repeated for each field effect transistor (FET) type offered by the technology. While Tox may be fairly uniform across a wafer, Lpoly may vary over a wide range across a chip. Lpoly variations may be local, depending on the surrounding patterns, or across a chip or wafer, depending on the gate lithographic and etch processes. Conventional methodology of using different test structures, physically separated from each other and embedded in a different optical Lpoly pattern, for each parameter measurement adds to the difficulty of making accurate correlation of these and other parameters with circuit function.

The present invention solves these problems by determining characteristics of MOS devices using a set of ring oscillators. Beneficially, a large number of characteristics may be determined from a single test structure having a set of ring oscillators. For example, in addition to performance (e.g., determined via gate delays of stages in ring oscillators), a single test structure may be used to determine physical gate length (Lpoly), gate oxide thickness (Tox), gate capacitance (C), effective gate resistance (Rsw), gate tunneling current (Ig), channel leakage current per unit width (Ic), active power (P), and additional characteristics. For ease of reference, the following disclosure is separated into two sections. The first section, entitled "Exemplary Apparatus," describes exemplary structures for determining MOS characteristics. The structures are stages and capacitive loads for ring oscillators, a ring oscillator, and a circuit containing a number of ring oscillators. The second section, entitled "Methods for Determining MOS Characteristics," describes exemplary steps using the structures described in the first section to determine characteristics of MOS devices.

Exemplary Apparatus

Figure 1A:
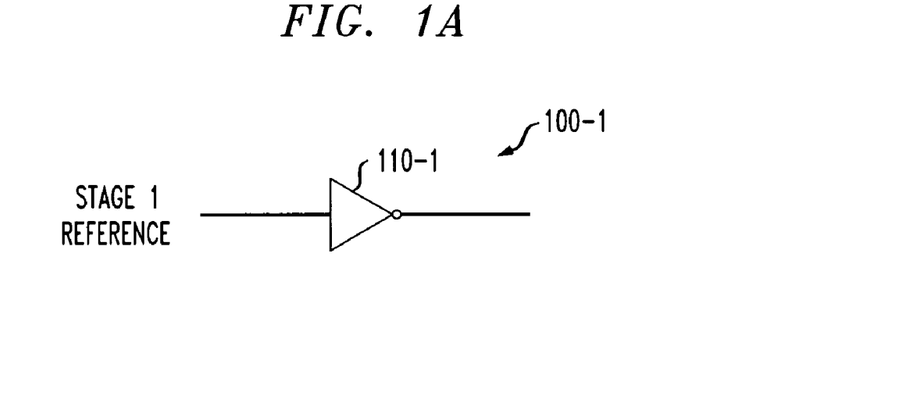
FIGS. 1A, 1B and 1C are examples of stages of ring oscillators, in accordance with preferred embodiments of the present invention.

Turning now to FIG. 1A, an exemplary stage 100-1 used in a ring oscillator is shown. An example ring oscillator is described in more detail in reference to FIG. 3, and a number of ring oscillators are used to determine characteristics of MOS devices, as described in more detail below. In FIG. 1A, stage 100-1 comprises a CMOS inverter 110-1. CMOS inverter 110-1 and other CMOS inverters described herein may be any set of devices used to invert a signal. Stage 110-1 will be referred to herein as a "reference stage." It is recommended that the CMOS inverter be the same CMOS inverter to be used for other MOS devices the technology will be used to create. The MOS gates (not shown) used in CMOS inverter 110-1 have a particular designed gate length, Lmask, of L1.

Figure 1B:
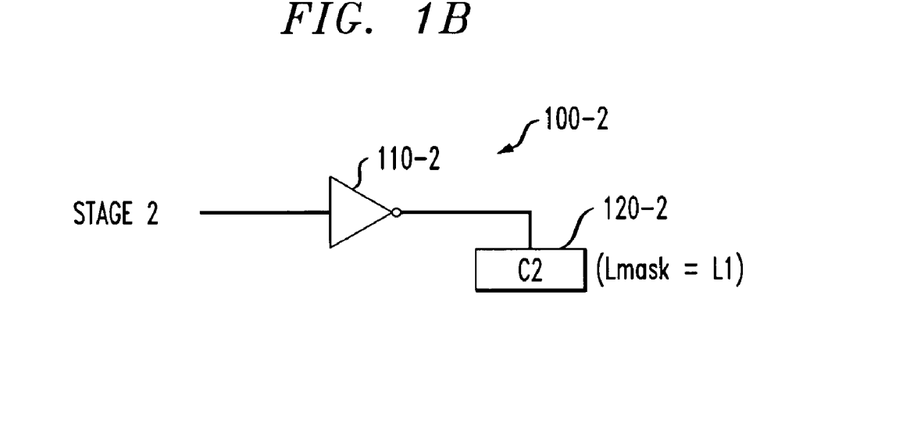
Figure 1C:
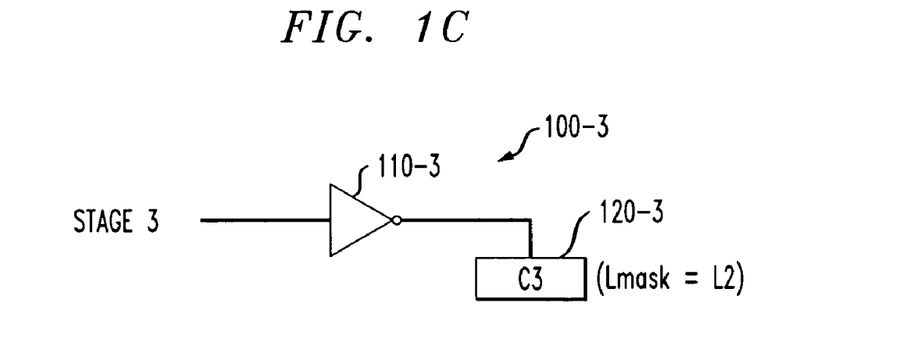
Figure 2A:
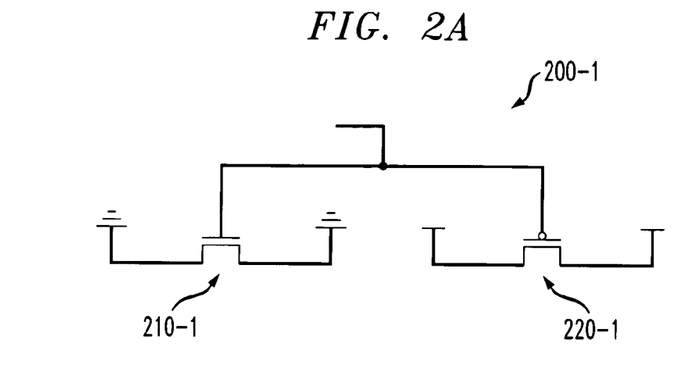
FIGS. 2A, 2B and 2C are examples of capacitive loads for stages in ring oscillators, in accordance with preferred embodiments of the present invention.
Figure 2B:
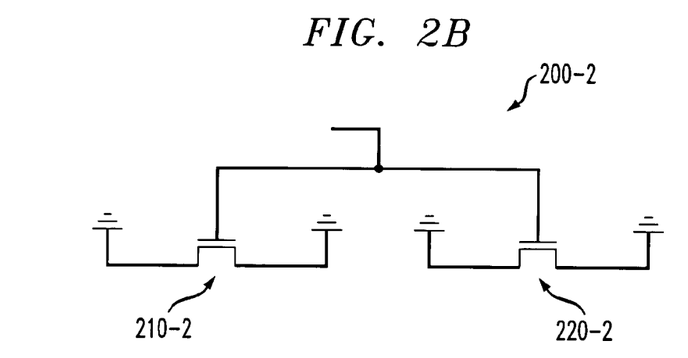
Figure 2C:
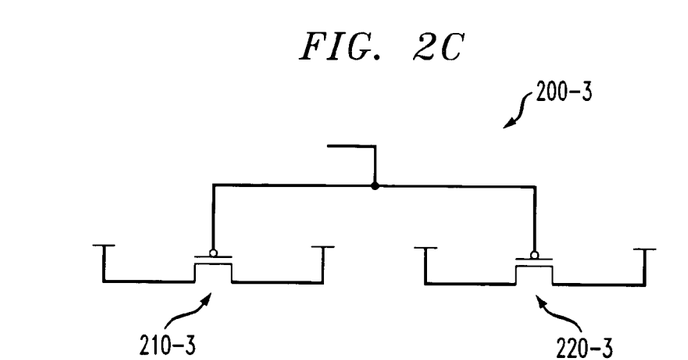

In FIG. 1B, stage 100-2 comprises a CMOS inverter 110-2 and a capacitive gate load 120-2. Exemplary capacitive gate loads are shown in FIGS. 2A through 2C. The capacitive gate load 120-2 is designed with a particular designed gate length, Lmask, of L2. In FIG. 1C, stage 100-3 comprises a CMOS inverter 110-3 and a capacitive gate load 120-3. The capacitive gate load 120-3 is generally designed with a particular designed gate length, Lmask, of L3. As described below, the different designed gate lengths, L2 and L3, may be used to determine load capacitance among other measurements.

In FIG. 2A, an exemplary capacitive gate load 200-1 is shown. Capacitive gate load 200-1 comprises an NMOS transistor 210-1 and a PMOS transistor 220-1. The NMOS transistor 210-1 has its source and drain coupled to ground, while the PMOS transistor 220-1 has its source and drain coupled to a power supply (e.g., Vdd). Capacitive gate load 200-1 is beneficial when it is desired to characterize the average of NMOS and PMOS devices with one capacitive gate load.

Nonetheless, it can be beneficial to split the NMOS and PMOS devices into separate capacitive loads, as this can allow better determination of capacitance for each of the NMOS or PMOS devices. This splitting is shown in FIGS. 2B and 2C. In FIG. 2B, an exemplary capacitive gate load 200-2 is shown. Capacitive gate load 200-2 comprises two NMOS transistors 210-2 and 220-2. The NMOS transistors 210-1 and 220-2 have their sources and drains coupled to ground. In FIG. 2C, an exemplary capacitive gate load 200-3 is shown. Capacitive gate load 200-3 comprises two PMOS transistors 210-3 and 220-3. The PMOS transistors 210-3 and 220-3 have their sources and drains coupled to a power supply (e.g., Vdd).

Although two devices per capacitive gate load 200 are shown, each capacitive gate load can comprise more or less devices. For instance, a capacitive gate load 200 could comprise a single device or four devices.

Figure 3:
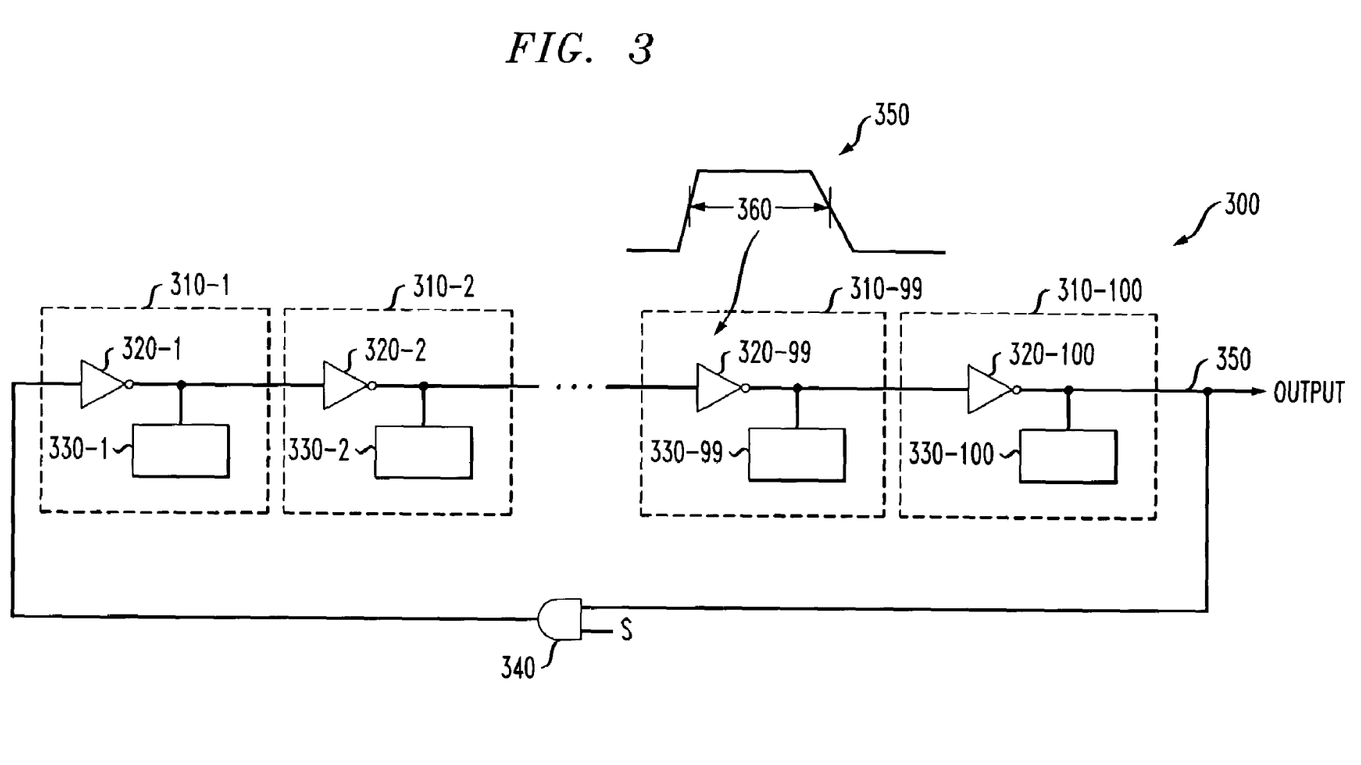
FIG. 3 is an example of a ring oscillator having a number of stages, in accordance with a preferred embodiment of the present invention.
Figure 4:
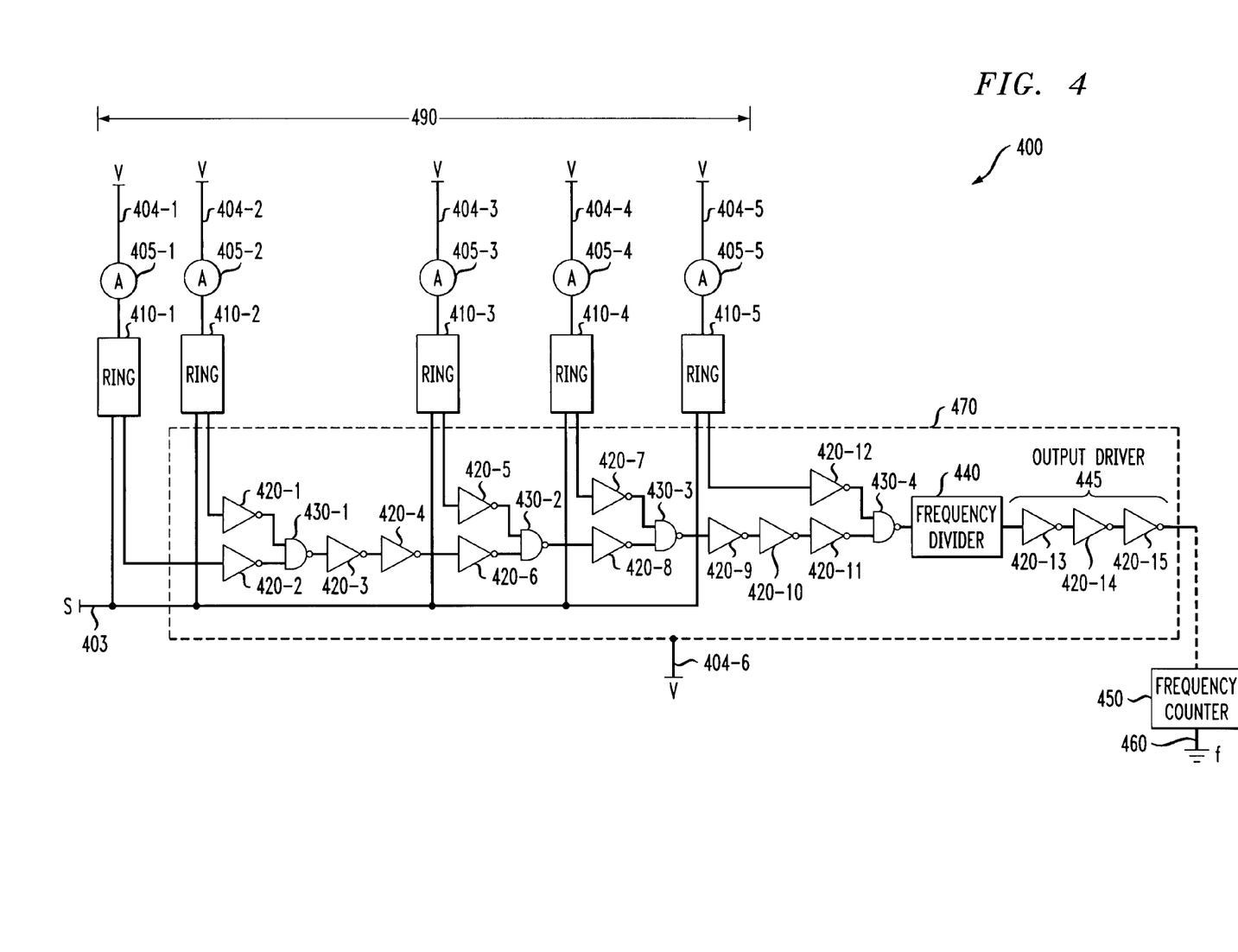
FIG. 4 is an example of a circuit for determining characteristics of MOS devices, in accordance with preferred embodiments of the invention.

Referring now to FIG. 3, a ring oscillator 300 is shown. Ring oscillator 300 comprises, in this example, 100 stages 310-1 through 310-100. The use of 100 stages is merely exemplary, and ring oscillator 300 may comprise many different numbers of stages. Each stage 310 is generally one of the stages 100-1, 100-2 or 100-3 of FIGS. 1A through 1B, and stages usually are not mixed in one ring oscillator. In other words, each state 310 will be one and only one of the stages 100-1, 100-2 or 100-3. In FIG. 3, a stage such as stage 100-2 of FIG. 2A is shown. Each stage 310 comprises a CMOS inverter 320 and a capacitive gate load 330. The ring oscillator 300 also comprises a NAND gate 340 and an output 350. The NAND gate 340 is used to enable or disable oscillations. The output 350 may be passed to a frequency divider and frequency counter, as shown in FIG. 4 or directly to an on-chip frequency counter (not shown). It should be noted that there are multiple possible locations for the output 350, and the location shown is merely exemplary.

Reference 350 illustrates a delay 360 for stage 310-99. A delay 360 occurs from the middle of the rise to the middle of the descent for a stage, such as stage 310-99. The delay 360 is a measure of performance for a stage of the ring oscillator 300. Delay 300 is preferably less than 30 picoseconds or whatever a suitable delay is for the technology being used to create the stages.

Multiple ring oscillators 300 may be uncoupled and data extracted from each of the ring oscillators 300. However, it is beneficial to form one circuit that couples multiple ring oscillators 300 and from which many MOS characteristics may be determined, as this limits across-chip effects and provides interface simplicity. One example of a single circuit having multiple ring oscillators is shown in FIG. 4.

Turning now to FIG. 4, a circuit 400 for determining characteristics of MOS devices is shown. Circuit 400 may be used to determine a number of characteristics of MOS devices. Exemplary characteristics are described below. Circuit 400 is generally formed in a kerf area of a semiconductor but may be placed in any suitable location. Circuit 400 is shown connected, in this example, to an external frequency counter. Circuit 400 comprises five ring oscillators 410-1 through 410-5 that are formed within a distance 490. Distance 490 is preferably less than 1,000 microns to reduce across-chip effects from affecting characterization. Each ring oscillator 410 has its own power supply 404 and current sensor 405. Circuit 400 further comprises a number of CMOS inverters 420-1 through 420-15, NAND gates 430-1 through 430-4, and frequency divider 440.

The ring oscillators 410 are enabled by using the S input 403. The measurement circuitry 470 uses a separate power supply 404-6 in order to minimize effects caused by using the same power supply for the measuring as for running the ring oscillators 410 and to allow independent current measurements on individual rings. Additionally, this allows each ring oscillator 410 to be separately powered on via one of the power supplies 404-1 through 404-5. Ring oscillators 410 are selected via the measurement circuitry 470. The portion of the measurement circuitry 470 beneath the ring oscillators 410 (i.e., NAND gates 430-1 through 430-4 and inverters 420-1 through 420-12) performs an OR function on the ring outputs such that the output of the single ring that is powered and selected is directed through the frequency divider 440 and output driver 445.

In this example, the frequency counter 450 is not part of the circuit 400. Instead, it is a separate conventional instrument used to measure frequency. However, the frequency counter 450 may be integrated into the chip design as part of the counter 450, generally by placing the frequency counter 450 between the frequency divider 440 and output driver 445, or by eliminating the frequency divider 440 altogether and using a clock input together with a counter to measure the ring oscillator frequency. The frequency counter 450 has an output 460, which allows a frequency to be determined. The output 460 can be a set of lines indicating a binary value convertible to frequency, for instance.

The S input 403 and voltage supplies 404 can be enabled in a number of ways. For instance, the S input 403 and voltage supplies 404 can be routed to pads, and voltage can be placed on the pad through various devices. A ring oscillator is enabled by applying voltage to the input power supply 404, generally at a pad (not shown), followed by applying a voltage to the S input 403, also generally at a pad (not shown).

In the example of FIG. 4, ring oscillator 410-1 corresponds to a ring oscillator having stages 110-1 of FIG. 1A. Ring oscillator 410-2 corresponds to a ring oscillator having stages 100-2 of FIG. 1B, where the stages 100-2 include the NMOS capacitive gate load 200-2 shown in FIG. 2B, with an Lmask of L2. The inverters (not shown) used in stages 110-2 of ring oscillator 410-2 are substantially identical to the inverters used in stages 110-1 of ring oscillators 410-1. "Substantially identical" generally means that the designs for the inverters in the stages 110-1 and 110-2 are the same, although slight differences in the physical inverters 110-1 and 110-2 might exist. Ring oscillator 410-3 corresponds to a ring oscillator having stages 100-3 of FIG. 1C, where the stages 100-3 include the NMOS capacitive gate load 200-2 shown in FIG. 2B, with an Lmask of L3. Ring oscillator 410-4 corresponds to a ring oscillator having stages 100-2 of FIG. 1B, where the stages 100-2 include the PMOS capacitive gate load 200-3 shown in FIG. 2C, with an Lmask of, for instance, L2. Ring oscillator 410-5 corresponds to a ring oscillator having stages 100-3 of FIG. 1C, where the stages 100-3 include the PMOS capacitive gate load 200-3 shown in FIG. 2C, with an Lmask of, for instance, L3. It should be noted that it is recommended that each inverter in the stages of the ring oscillators 410 be the same inverter. That is, it is recommended that each inverter have the same designed gate length for the NMOS and PMOS devices therein.

Thus, ring oscillator 410-1 includes reference stages, ring oscillators 410-2 and 410-3 include NMOS stages having two different Lmasks, and ring oscillators 410-4 and 410-5 include PMOS stages having two different Lmasks. This configurations allows accurate characteristic an individual measurements for both NMOS and PMOS devices.

As another example, three ring oscillators 410-1 could be used. In this second example (which is used as one of the bases for the methods given below), ring oscillator 410-1 corresponds to a ring oscillator having stages 110-1 of FIG. 1A. Ring oscillator 410-2 corresponds to a ring oscillator having stages 100-2 of FIG. 1B, where the stages 100-2 include the NMOS/PMOS capacitive gate load 200-1 shown in FIG. 2A, with an Lmask of L2. Ring oscillator 410-3 corresponds to a ring oscillator having stages 100-3 of FIG. 1C, where the stages 100-3 include the NMOS/PMOS capacitive gate load 200-1 shown in FIG. 2A, with an Lmask of L3.

Thus, in this second example, ring oscillator 410-1 includes reference stages, while ring oscillators 410-2 and 410-3 include NMOS/PMOS capacitive loads having different Lmasks.

Methods for Determining MOS Characteristics

Now that the apparatus used to determine characteristics of MOS devices have been described, methods for determining MOS characteristics by using the apparatus is described. The following method uses the second example above, which uses three ring oscillators. The first ring oscillator has stages of inverters. The second ring oscillator has stages of inverters along with NMOS/PMOS load devices, as shown in FIG. 2B, with a relatively small Lmask. The third ring oscillator has stages of inverters along with NMOS/PMOS load devices, as shown in FIG. 2B, with a relatively large Lmask.

Lpoly and Tox are derived by using a difference technique, which eliminates the influence of unknown parasitic resistances and capacitances and allows the influence of each component (i.e., Lpoly and Tox) to be separated from the measurement.

The measurements made include the following: ring oscillator frequency, f, current drawn when the ring is switching, Ia; and current drawn when the ring is quiescent, Io. The delay per stage, D, is calculated from the measured ring oscillator frequency as follows:

$$D = 1/(2*n*f) \quad (1)$$

where n is the number of stages in the ring. The load capacitance per stage is given by the following:

$$C = 2*(Ia - Io)*D/Vdd, \quad (2)$$

where Vdd is the power supply voltage. The delay and capacitance per stage for the three ring oscillators are denoted by D1, D2, D3 and C1, C2 and C3, respectively. The capacitance is usually measured at 0.8× the nominal supply voltage for the technology and the short circuit power is negligible.

a) Determination of Lpoly

Figure 5:
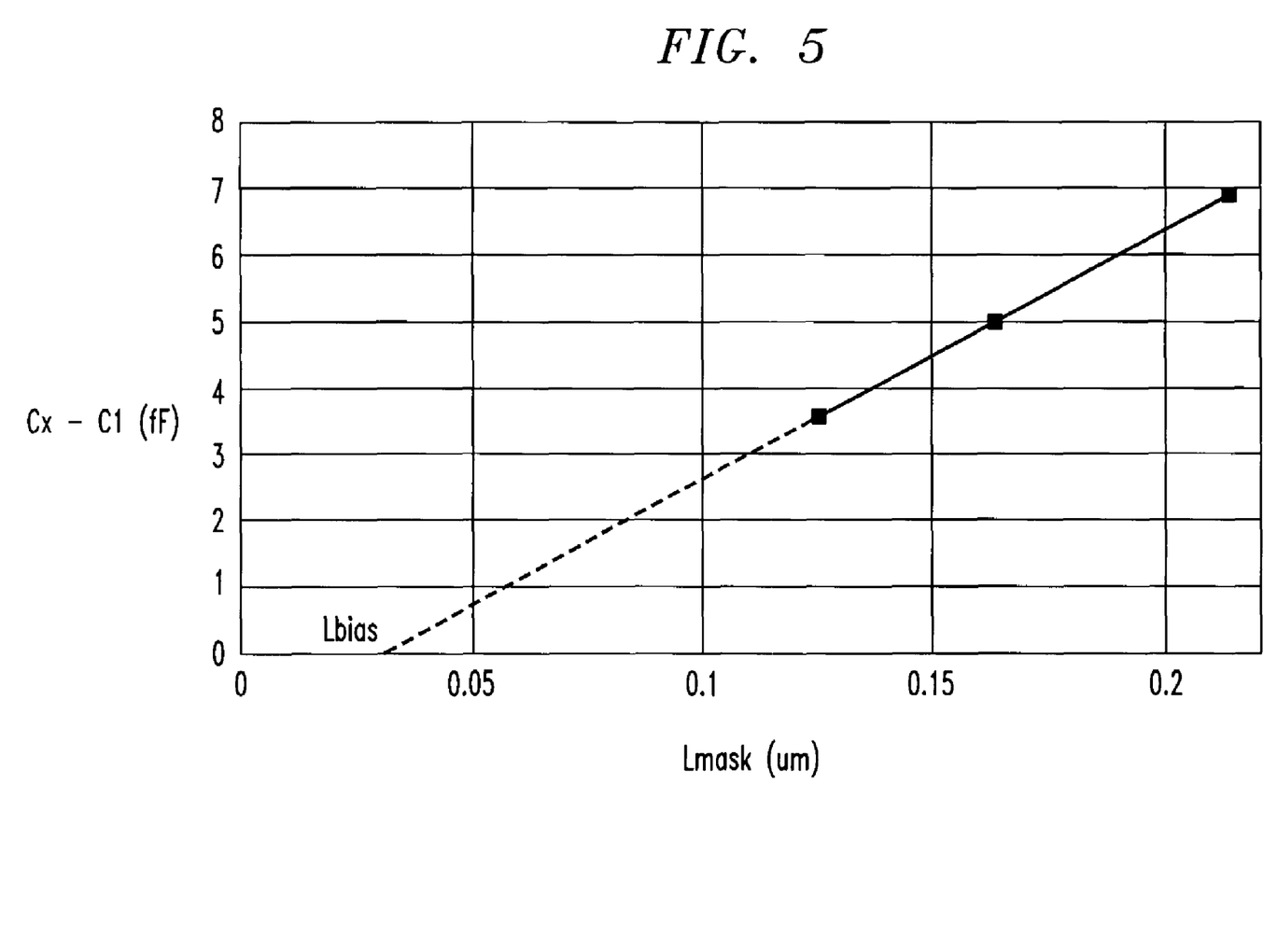
FIG. 5 is a diagram used to determine Lbias.

The load capacitance CG1 (i.e., C2−C1) and CG2 (i.e., C3−C1) are plotted against Lmask in FIG. 5. As previously described, the Lmask is the Lpoly design dimension. It should be noted that the Lmask is the "stepped down" dimension that should appear on the surface of a semiconductor. The intercept on the x-axis gives the bias length, Lbias, where Lpoly=Lmask−Lbias. More than three ring oscillators may be used for better accuracy as is the case in FIG. 5, where four ring oscillators have been used. Lbias is generally calibrated against measurements made on physical cross-sections using a scanning electron microscope as practiced currently with the capacitance or resistance tests structures. This introduces a one-time, per-technology, fixed adjustment to Lbias that takes into account fringe field effects. The techniques described herein are then used on a regular bases, along with this fixed adjustment, to monitor and track Lpoly and other characteristics.

b) Determination of Tox

The effective gate oxide thickness, Tox, may be determined as $$Tox=k(L3mask-L2mask)*W/(C3-C2), \quad (3)$$

where k is the dielectric constant, and W is the width of the gate. This result is totally independent of Lbias.

c) Simultaneous Determination of other MOSFET Parameters

There are several other MOSFET parameters that can be directly determined from the same product representative ring oscillators, such as used in circuit 400 of FIG. 4, used to determine Lpoly and Tox. While these other parameters could be determined from other structures, it is extremely valuable to have this information all coming from the same structures used to determine Lpoly and Tox, as this then provides a self consistent set of data free from the effects of across-chip linewidth variation (ACLV) and other variations coming from, for example, different local environments.

The gate delay, which is a direct measure of performance, is already known from Equation (1).

The gate delay is related to the effective gate resistance, Rsw, during switching. The effective gate resistance is the inverse of the gate drive strength and related to Vt as follows:

$$Rsw=(D2-D1)/(C2-C1). \quad (4)$$

The gate tunneling current, Ig, per unit area is given by the following:

$$Ig=(Io3-Io1)/\{2n*(W*(L3mask-L2mask))\} \quad (5)$$

As with the equation for Tox, the evaluation of Ig in no way involves knowledge of Lbias. The channel leakage current per unit width, Ic, averaged over NMOS and PMOS is given by $$Ic=(Io1/n)-Ig*Lpoly*(Wn+Wp)/2 \quad (6)$$

The active power P is given by $$P=(Ia-Io)*Vdd-0.5° C.*Vdd^2/D, \quad (7)$$

where C is the effective total capacitance.

The short circuit power at a supply voltage Vdd1 is as follows:

$$Psc=P(Vdd1)-0.5° C.*Vdd1^2/D \quad (8)$$

where Vdd<Vdd1 and C is determined from Equation (7).

d) Other MOSFET and Wire Parameters

The difference technique may be extended to measurement of wire resistances and capacitances, delay and leakage currents as a function of stack height in stacked gates (NANDs and NORs) and Rsw of different gate types. The contributions of NMOS and PMOS may be separated by making the gate delay dominated by either the NMOS or PMOS. It may also be used to estimate and calibrate parasitic resistances and capacitances by implementing different layout schemes.

It is to be understood that the embodiments and variations shown and described herein are merely illustrative of the principles of this invention and that various modifications may be implemented by those skilled in the art without departing from the scope and spirit of the invention. For instance, each of the ring oscillators in circuit 400 of FIG. 4 may be individually created and data extracted separately from each. Generally, each ring oscillator would then have a frequency divider and output driver associated with it. Each ring oscillator may also have a frequency counter associated with it. Additionally, there may be multiple different ring oscillators used, a set of the ring oscillators having different designed gate lengths. This allows, as shown in FIG. 5, a better determination of Lbias.

What is claimed is:

1. A method for determining characteristics of metal oxide semiconductor (MOS) devices, the method comprising the steps of:
   providing a plurality of ring oscillators, the plurality of ring oscillators located within a predetermined distance of one another, each ring oscillator comprising a plurality of coupled stages, wherein:
      each of the plurality of coupled stages for a first given ring oscillator comprises an inverter having at least one first MOS device having a first designed gate length;
      each of the plurality of coupled stages for a second given ring oscillator comprises an inverter substantially identical to the inverters in the coupled stages of the first given ring oscillator and coupled to at least one second MOS device having a second designed gate length;
      each of the plurality of coupled stages for a third given ring oscillator comprises an inverter substantially identical to the inverters in the coupled stages of the first given ring oscillator and coupled to at least one third MOS device having a third designed gate length;
      the second and third designed gate lengths are different; and
      one of the second and third designed gate lengths is substantially equal to the first designed gate length;
   determining performance by using at least one of the given ring oscillators; and
   determining, using the plurality of ring oscillators, at least one additional characteristic of MOS devices in the plurality of ring oscillators.

2. The method of claim 1, wherein the step of determining performance further comprises the steps of causing the at least one given ring oscillator to oscillate so that a delay of a coupled stage in the at least one given ring oscillator is under 30 picoseconds.

3. The method of claim 1, wherein the predetermined distance is substantially 1,000 microns or less.

4. The method of claim 1, wherein the plurality of ring oscillators are coupled together through circuitry.

5. The method of claim 1, wherein the at least one second MOS device comprises an NMOS gate and a PMOS gate coupled together in parallel, and wherein the at least one third MOS device comprises an NMOS gate and a PMOS gate coupled together in parallel.

6. The method of claim 1, wherein the plurality of ring oscillators comprise five ring oscillators, wherein the at least one second MOS device comprises at least one NMOS gate, wherein the at least one third MOS device comprises at least one NMOS gate, wherein each of the plurality of coupled stages for a fourth given ring oscillator comprises an inverter coupled to at least one first PMOS gate having a fourth designed gate length, and wherein each of the plurality of stages for a fifth given ring oscillator comprises an inverter coupled to at least one second PMOS gate having a fifth designed gate length, wherein the fourth and fifth designed gate lengths are different.

7. The method of claim 1, wherein the plurality of ring oscillators comprise a fourth given ring oscillator, wherein each of the plurality of stages for the fourth given ring oscillator comprises an inverter coupled to at least one fourth MOS device having a fourth designed gate length, wherein the fourth designed gate length is larger than the third designed gate length, and wherein the third designed gate length is larger than the second designed gate length.

8. The method of claim 7, wherein each of the at least one second, third and fourth MOS devices comprises at least one NMOS gate.

9. The method of claim 7, wherein each of the at least one second, third and fourth MOS devices comprises at least one PMOS gate.

10. The method of claim 1, wherein the step of determining at least one additional characteristic further comprises the steps of:
measuring a frequency of oscillation for each of at least the first, second, and third given ring oscillators of the plurality of ring oscillators;
determining delay for each of at least the first, second, and third given ring oscillators of the plurality of ring oscillators by using at least a corresponding one of the frequencies;
measuring active and quiescent current for each of at least the first, second, and third given ring oscillators of the plurality of ring oscillators;
determining load capacitance per stage for each of at least the first, second, and third given ring oscillators of the plurality of ring oscillators by using, for a respective one of the ring oscillators, at least the active and quiescent currents and delay.

11. The method of claim 10, wherein the step of determining at least one additional characteristic of MOS devices further comprises the step of determining physical gate length for a selected one of the given ring oscillators by using the designed gate length for the selected one of the ring oscillators and a bias length.

12. The method of claim 11, wherein the step of determining at least one additional characteristic of MOS devices further comprises the step of determining bias length by comparing capacitances determined for at least each of the first, second and third given ring oscillators with designed gate length for at least each of the first, second and third given ring oscillators.

13. The method of claim 11, wherein the selected one given ring oscillator is the third given ring oscillator, wherein the third designed gate length is greater than the second designed gate length, and wherein the step of determining at least one additional characteristic of MOS devices further comprises the step of determining gate tunneling current per unit area by using at least the active current for the second and the third given ring oscillators and the designed gate lengths for the second and third given ring oscillators.

14. The method of claim 10, wherein the step of determining at least one additional characteristic of MOS devices further comprises the step of determining a thickness of oxide by using at least the load capacitance per stage for the second given ring oscillator and the load capacitance per stage for the third given ring oscillator.

15. The method of claim 10, wherein the step of determining at least one additional characteristic of MOS devices further comprises the step of determining an effective gate resistance by using at least the delays and capacitances for the first given ring oscillator and another of the given ring oscillators.

16. The method of claim 12, wherein the step of determining at least one additional characteristic of MOS devices further comprises the step of determining channel leakage current per unit width by using at least the gate tunneling current, the quiescent current for the first given ring oscillator and the physical gate length for the first given ring oscillator.

17. The method of claim 10, wherein the step of determining at least one additional characteristic of MOS devices further comprises the step of determining active power by using at least the active current and quiescent current for a selected one of the ring oscillators or by using the load capacitance and delay for a selected one of the ring oscillators.

18. The method of claim 10, wherein the step of determining at least one additional characteristic of MOS devices further comprises the step of determining short circuit power at a supply voltage by using the load capacitance, the supply voltage, and the delay for a selected one of the ring oscillators.

19. An apparatus for determining characteristics of metal oxide semiconductor (MOS) devices, the apparatus comprising:
a plurality of ring oscillators, the plurality of ring oscillators located within a predetermined distance of each other, each ring oscillator comprising a plurality of coupled stages, wherein:
each of the plurality of coupled stages for a first given ring oscillator comprises an inverter having at least one first MOS device having a first designed gate length;
each of the plurality of coupled stages for a second given ring oscillator comprises an inverter substantially identical to the inverters in the coupled stages of the first given ring oscillator and coupled to at least one second MOS device having a second designed gate length;
each of the plurality of coupled stages for a third given ring oscillator comprises an inverter substantially identical to the inverters in the coupled stages of the first given ring oscillator and coupled to at least one third MOS device having a third designed gate length;
the second and third designed gate lengths are different; and
one of the second and third designed gate lengths is substantially equal to the first designed gate length.

20. The apparatus of claim 19, wherein each ring oscillator comprises a frequency divider.

21. The apparatus of claim 19, wherein the ring oscillators are coupled together through circuitry.

22. The apparatus of claim 21, wherein the circuitry comprises a frequency divider coupled to each of the ring oscillators.

23. The apparatus of 19, wherein each of ring oscillators is coupled to an independent power supply, and wherein the circuitry is coupled to another independent power supply.

24. The apparatus of claim 23, wherein each independent power supply can be separately enabled.

25. The apparatus of claim 19, wherein the at least one second MOS device comprises an NMOS gate and a PMOS gate coupled together in parallel, and wherein the at least one third MOS device comprises an NMOS gate and a PMOS gate coupled together in parallel.

26. The apparatus of claim 19, wherein the plurality of ring oscillators comprise five ring oscillators, wherein the at least one second MOS device comprises at least one NMOS gate, wherein the at least one third MOS device comprises at least one NMOS gate, wherein each of the plurality of coupled stages for a fourth given ring oscillator comprises an inverter coupled to at least one first PMOS gate having a fourth designed gate length, wherein each of the plurality of coupled stages for a fifth given ring oscillator comprises an inverter coupled to at least one second PMOS gate having a fifth designed gate length, and wherein the fourth and fifth designed gate lengths are different.

27. The apparatus of claim 19, wherein the plurality of ring oscillators comprise a fourth given ring oscillator, wherein each of the plurality of coupled stages for the fourth given ring oscillator comprises an inverter coupled to at least one fourth MOS device having a fourth designed gate length, wherein the fourth designed gate length is greater than the third designed gate length, and wherein the third designed gate length is greater than the second designed gate length.

28. The apparatus of claim 27, wherein each of the at least one second, third and fourth MOS devices comprises at least one NMOS gate.

29. The apparatus of claim 27, wherein each of the at least one second, third and fourth MOS devices comprises at least one PMOS gate.

30. A mechanism for determining characteristics of metal oxide semiconductor (MOS) devices including at least one circuit comprising:
a plurality of ring oscillators, the plurality of ring oscillators located within a predetermined distance of each other, each ring oscillator comprising a plurality of coupled stages, wherein:
each of the plurality of coupled stages for a first given ring oscillator comprises an inverter having at least one first MOS device having a first designed gate length;
each of the plurality of coupled stages for a second given ring oscillator comprises an inverter substantially identical to the inverters in the coupled stages of the first given ring oscillator and coupled to at least one second MOS device having a second designed gate length;
each of the plurality of coupled stages for a third given ring oscillator comprises an inverter substantially identical to the inverters in the coupled stages of the first given ring oscillator and coupled to at least one third MOS device having a third designed gate length;
the second and third designed gate lengths are different; and
one of the second and third designed gate lengths is substantially equal to the first designed gate length.

31. A method for determining characteristics of metal oxide semiconductor (MOS) devices, the method comprising the steps of:
determining performance by using at least one of a plurality of ring oscillators, the plurality of ring oscillators located within a predetermined distance of one another, each ring oscillator comprising a plurality of coupled stages, wherein:
each of the plurality of coupled stages for a first given ring oscillator comprises an inverter having at least one first MOS device having a first designed gate length;
each of the plurality of coupled stages for a second given ring oscillator comprises an inverter substantially identical to the inverters in the coupled stages of the first given ring oscillator and coupled to at least one second MOS device having a second designed gate length;
each of the plurality of coupled stages for a third given ring oscillator comprises an inverter substantially identical to the inverters in the coupled stages of the first given ring oscillator and coupled to at least one third MOS device having a third designed gate length;
the second and third designed gate lengths are different; and
one of the second and third designed gate lengths is substantially equal to the first designed gate length; and
determining, using the plurality of ring oscillators, at least one additional characteristic of MOS devices in the plurality of ring oscillators.

* * * * *

UNITED STATES PATENT AND TRADEMARK OFFICE
CERTIFICATE OF CORRECTION

PATENT NO. : 7,069,525 B2
APPLICATION NO. : 10/623249
DATED : June 27, 2006
INVENTOR(S) : Bhushan et al.

It is certified that error appears in the above-identified patent and that said Letters Patent is hereby corrected as shown below:

In column 7, line 60, replace " $P = (Ia - Io) * Vdd = 0.5° C. * Vdd^2 / D$ " with -- $P = (Ia - Io)*Vdd = 0.5 * C * Vdd^2 / D$ --.

In column 7, line 65, replace " $Psc = P(Vdd1) - 0.5°C.*Vdd1^2 / D$" with -- $Psc = P(Vdd1) - 0.5 * C * Vdd1^2 / D$ --.

Signed and Sealed this

Fifth Day of December, 2006

JON W. DUDAS
*Director of the United States Patent and Trademark Office*